(12) United States Patent
Jisong

(10) Patent No.: US 10,964,593 B2
(45) Date of Patent: Mar. 30, 2021

(54) METHOD FOR FORMING A SEMICONDUCTOR STRUCTURE WITH A GATE CONTACT PLUG

(71) Applicants: Semiconductor Manufacturing International (Shanghai) Corporation, Shanghai (CN); Semiconductor Manufacturing International (Beijing) Corporation, Beijing (CN)

(72) Inventor: Jin Jisong, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 7 days.

(21) Appl. No.: 16/537,158

(22) Filed: Aug. 9, 2019

(65) Prior Publication Data
US 2020/0343138 A1 Oct. 29, 2020

(30) Foreign Application Priority Data

Apr. 29, 2019 (CN) .......................... 201910356555.2

(51) Int. Cl.
*H01L 21/8238* (2006.01)
*H01L 21/768* (2006.01)
(Continued)

(52) U.S. Cl.
CPC .... *H01L 21/76897* (2013.01); *H01L 21/0217* (2013.01); *H01L 21/02167* (2013.01);
(Continued)

(58) Field of Classification Search
CPC ......... H01L 21/76897; H01L 29/66795; H01L 29/785; H01L 27/0924; H01L 21/823871;
(Continued)

(56) References Cited

U.S. PATENT DOCUMENTS 7,115,974 B2 * 10/2006 Wu ................... H01L 21/76832
257/649
8,569,124 B2 * 10/2013 Akiyama .......... H01L 29/66431
438/197
(Continued)

*Primary Examiner* — Shouxiang Hu
(74) *Attorney, Agent, or Firm* — Brinks Gilson & Lione

(57) ABSTRACT

A semiconductor structure and a method for forming the same are provided. In one form, the method includes: providing a base, a gate structure being formed on the base, a source/drain doped layer being formed within the base on both sides of the gate structure, and an initial dielectric layer being formed on the base exposed from the gate structure, the initial dielectric layer covering a top of the gate structure, and a source/drain contact plug electrically connected to the source/drain doped layer being formed within the initial dielectric layer on the top of the source/drain doped layer; removing a portion of a thickness of the initial dielectric layer to form a dielectric layer exposing a portion of a side wall of the source/drain contact plug; forming an etch stop layer on at least the side wall of source/drain contact plug exposed from the dielectric layer; etching the dielectric layer on the top of the gate structure using etch stop layers on side walls of adjacent source/drain contact plugs as lateral stop positions, to form a gate contact exposing the top of the gate structure; forming, within the gate contact, a gate contact plug electrically connected to the gate structure. Implementations of the present disclosure facilitate enlargement of a process window for forming a contact over active gate.

13 Claims, 7 Drawing Sheets

(51) Int. Cl.
  *H01L 29/66*    (2006.01)
  *H01L 29/78*    (2006.01)
  *H01L 27/092*   (2006.01)
  *H01L 21/02*    (2006.01)
  *H01L 21/311*   (2006.01)
  *H01L 21/3105*  (2006.01)

(52) U.S. Cl.
  CPC .. *H01L 21/31053* (2013.01); *H01L 21/31144* (2013.01); *H01L 21/76802* (2013.01); *H01L 21/76843* (2013.01); *H01L 21/76877* (2013.01); *H01L 21/823814* (2013.01); *H01L 21/823821* (2013.01); *H01L 21/823871* (2013.01); *H01L 27/0924* (2013.01); *H01L 29/66795* (2013.01); *H01L 29/785* (2013.01)

(58) Field of Classification Search
  CPC ......... H01L 21/0217; H01L 21/823814; H01L 21/823821; H01L 21/02167; H01L 21/76802; H01L 21/76843; H01L 21/31144; H01L 21/76877; H01L 21/76834; H01L 21/31053
  See application file for complete search history.

(56) References Cited

U.S. PATENT DOCUMENTS

| | | | |
|---|---|---|---|
| 10,510,598 B2 * | 12/2019 | Hsieh | ................ H01L 29/6653 |
| 2010/0148274 A1 * | 6/2010 | Tai | .................... H01L 21/76895 |
| | | | 257/369 |
| 2016/0020148 A1 * | 1/2016 | Song | ................ H01L 21/76843 |
| | | | 438/238 |

* cited by examiner

METHOD FOR FORMING A SEMICONDUCTOR STRUCTURE WITH A GATE CONTACT PLUG

RELATED APPLICATIONS

The present application claims priority to Chinese Patent Appln. No. 201910356555.2, filed Apr. 29, 2019, the entire disclosure of which is hereby incorporated by reference.

BACKGROUND

Technical Field

Implementations and implementations of the present disclosure relate to a field of semiconductor manufacturing, and in particular to a semiconductor structure and a method for forming same.

Related Art

With continuous developments of integrated circuit manufacturing technologies, people impose increasingly higher requirements on an integration level and performance of an integrated circuit. In order to increase an integration level and reduce costs, critical dimensions of parts and components become increasingly smaller, and a circuit density within the integrated circuit is increasingly larger. Consequently, a wafer surface is incapable of providing a sufficient area to fabricate a required interconnecting wire due to such a development.

In order to meet requirements of the interconnecting wire undergoing of critical dimension reduction, currently, conduction between different metal layers or from a metal layer to a base is achieved using an interconnecting structure. The interconnecting structure includes an interconnecting wire and a contact plug formed within a contact opening. The contact plug is connected to a semiconductor device, and the interconnecting wire achieves a connection between contact plugs, thereby constituting a circuit.

A contact plug within a transistor structure includes a gate contact plug on a surface of a gate structure for achieving a connection of the gate structure to an external circuit, and further includes a source/drain contact plug located on a surface of a source/drain doped layer for achieving a connection of the source/drain doped layer to the external circuit.

Currently, in order to achieve further reduction of a transistor area, a contact over active gate (COAG) process is introduced. Compared with that a conventional gate contact plug is located over a gate structure in an isolation region, in the COAG process, the gate contact plug can be located over the gate structure in an active area (AA), thereby further saving an area of a chip.

SUMMARY

A problem to be addressed by implementations of the present disclosure is to provide a semiconductor structure and a method for forming same, and to enlarge a process window for forming a COAG.

To address the foregoing problem, one form of the present disclosure provides a method for forming a semiconductor structure, including: providing a base, a gate structure being formed on the base, a source/drain doped layer being formed within the base on both sides of the gate structure, and an initial dielectric layer being formed on the base exposed from the gate structure, the initial dielectric layer covering the top of the gate structure, and a source/drain contact plug being formed within the initial dielectric layer on the top of the source/drain doped layer, and the source/drain contact plug being electrically connected to the source/drain doped layer; removing a portion of a thickness of the initial dielectric layer to form a dielectric layer, exposing a portion of a side wall of the source/drain contact plug; forming an etch stop layer on at least the side wall of the source/drain contact plug exposed from the dielectric layer; etching the dielectric layer on the top of the gate structure using etch stop layers on side walls of the adjacent source/drain contact plugs as lateral stop positions, to form a gate contact exposing the top of the gate structure; forming a gate contact plug within the gate contact, the gate contact plug being electrically connected to the gate structure.

Implementations of the present disclosure further provide a semiconductor structure, including: a base; a gate structure located on the base; a source/drain doped layer located within the base on both sides of the gate structure; a dielectric layer located on the base exposed from the gate structure, the dielectric layer covering the top of the gate structure; a source/drain contact plug located within the dielectric layer on the top of the source/drain doped layer, and the source/drain contact plug being electrically connected to the source/drain doped layer, and the top of the source/drain contact plug being higher than that of the dielectric layer; an etch stop layer located at least on a side wall of the source/drain contact plug exposed from the dielectric layer; a gate contact located within a dielectric layer between etch stop layers on side walls of the adjacent source/drain contact plugs, the gate contact exposing the top of the gate structure.

Compared with the prior art, technical solutions of implementations of the present disclosure have the following advantages:

In implementations of the present disclosure, after the dielectric layer exposing a portion of a side wall layer of the source/drain contact plug is formed, the etch stop layer is formed on at least the side wall of the source/drain contact plug exposed from the dielectric layer. The etch stop layer can define a lateral etch stop position of the gate contact etching process in a subsequent step of forming the gate contact, to prevent causing a loss to the source/drain contact plug in the gate contact etching process, thereby reducing difficulty in forming the gate contact. Correspondingly, after the gate contact plug is formed within the gate contact subsequently, the etch stop layer can define a space between the source/drain contact plug and the gate contact plug and achieve isolation between both, so that the gate contact plug can be formed between the adjacent source/drain contact plugs while preventing a short circuit from occurring between the gate contact plug and the source/drain contact plug, which facilitates enlargement of a process window for forming the contact over active gate (COAG).

DETAILED DESCRIPTION

A current process window for forming a COAG is relatively small and a process is relatively difficult. A method for forming a semiconductor structure is now combined to analyze reasons why the process window is relatively small and the process is relatively difficult.

Referring to FIG. 1 to FIG. 7, schematic structural diagrams of steps in one form of a method for forming a semiconductor structure are shown.

Figure 1:
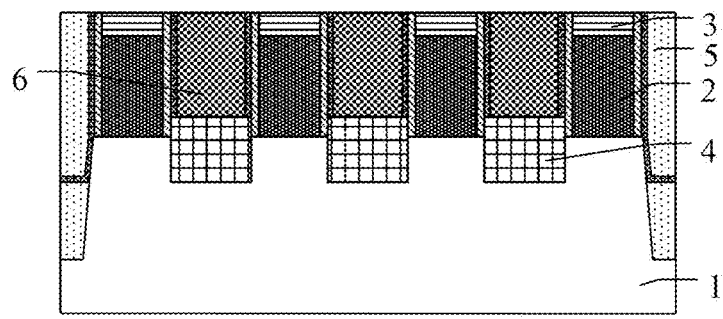
FIG. 1 to FIG. 7 are schematic structural diagrams of steps in one form of a method for forming a semiconductor structure.

Referring to FIG. 1, a base 1 is provided, a gate structure 2 being formed on the base 1, a self-aligned stop layer 3 being formed on the top of the gate structure 2, a source/drain doped layer 4 being formed within the base 1 on both sides of the gate structure 2, a bottom dielectric layer 5 being formed on the base 1 exposed from the gate structure 2, the bottom dielectric layer 5 exposing the top of the self-aligned stop layer 3, a source/drain contact plug 6 being formed within the bottom dielectric layer 5 on the top of the source/drain doped layer 4, and the source/drain contact plug 6 being electrically connected to the source/drain doped layer 4.

Figure 2:
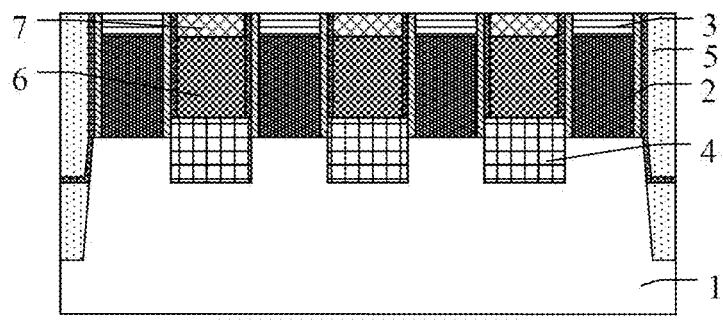

Referring to FIG. 2, a portion of a thickness of the source/drain contact plug 6 is removed and a groove (not shown in the figure) is formed within the bottom dielectric layer 5; a protection layer 7 being formed within the groove.

Figure 3:
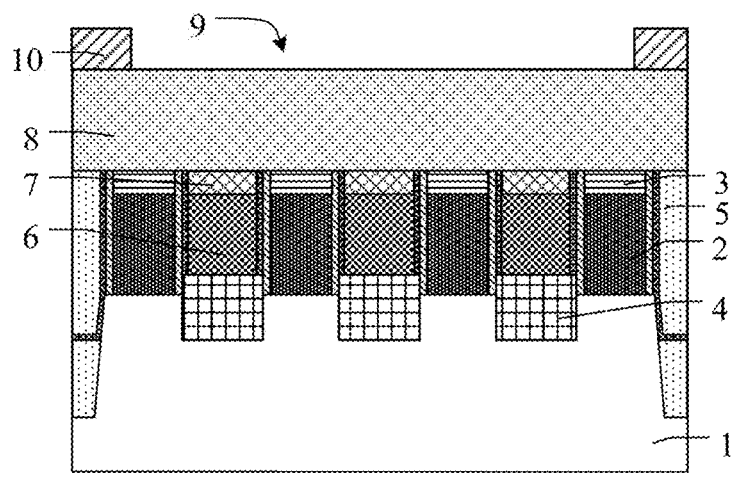

Referring to FIG. 3, the top dielectric layer 8 is formed, which covers the self-aligned stop layer 3, the protection layer 7, and the bottom dielectric layer 5. A hard mask layer 10 having a mask opening 9 being formed on the top dielectric layer 8.

Figure 4:
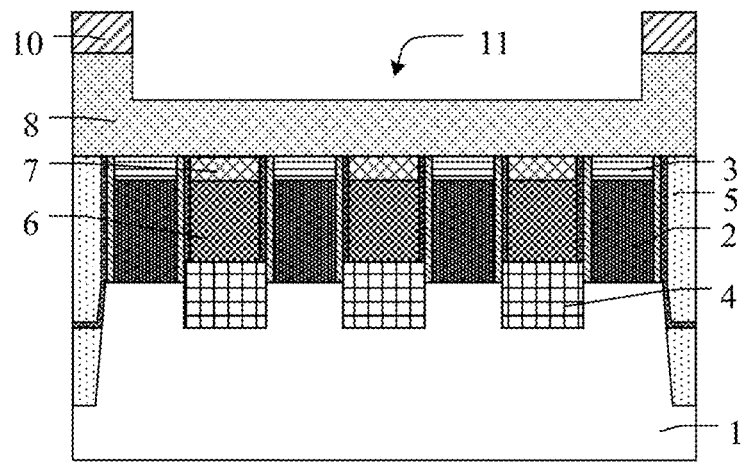

Referring to FIG. 4, a portion of the thickness of the top dielectric layer 8 is etched using the hard mask layer 10 as a mask, to form a trench 11 in the top dielectric layer 8.

Figure 5:
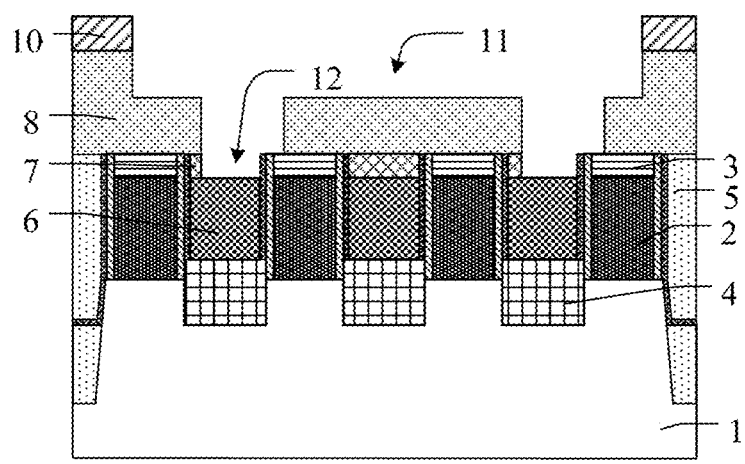

Referring to FIG. 5, the top dielectric layer 8 and the protection layer 7 on a portion of the top of the source/drain contact plug 6 are etched using the hard mask layer 10 as a partial mask, to form a via 12 exposing the top of the source/drain contact plug 6.

Figure 6:
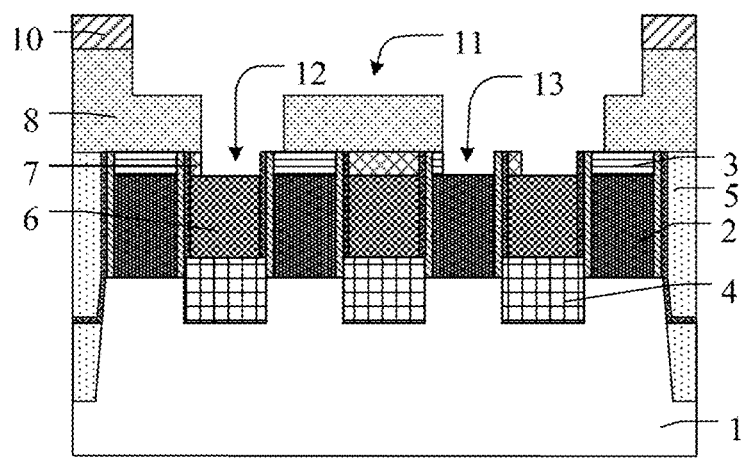

Referring to FIG. 6, after the via 12 is formed, the top dielectric layer 8 and the self-aligned stop layer 3 on a portion of the top of the gate structure 2 are etched using the hard mask layer 10 as a partial mask, to form a gate contact 13 exposing the top of the gate structure 2.

Figure 7:
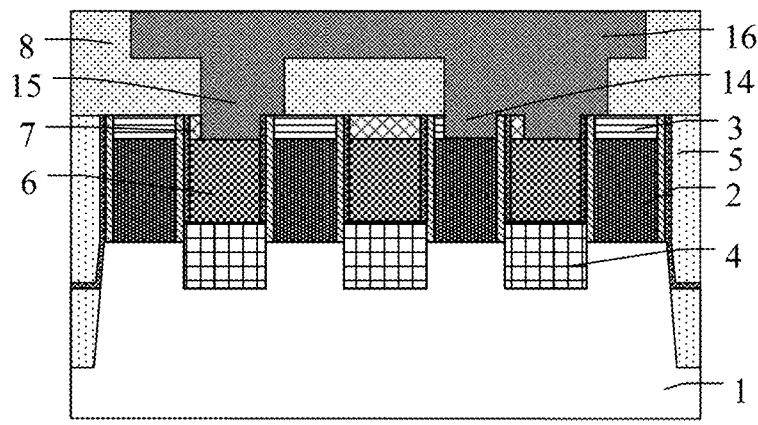
Figure 8:
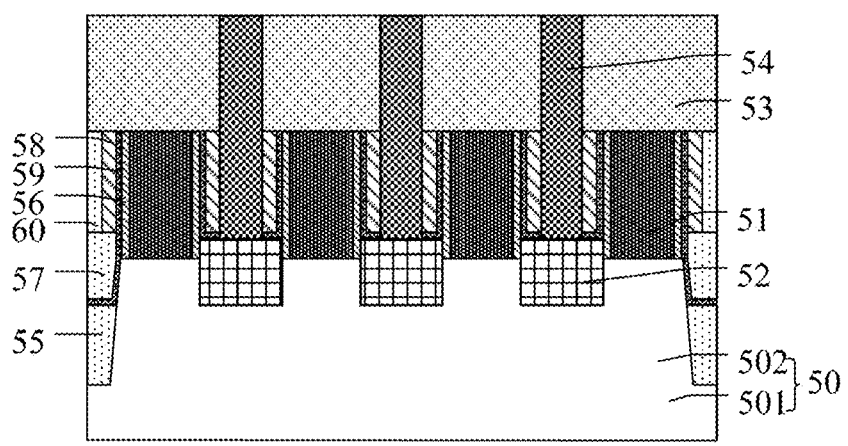
FIG. 8 to FIG. 18 are schematic structural diagrams of steps in another form of a method for forming a semiconductor structure.

Referring to FIG. 7, a conductive material layer (not marked) filling the gate contact 13, the via 12, and the trench 11 is formed, a conductive material layer located within the gate contact 13 being used as a gate contact plug 14, and the gate contact plug 14 being electrically connected to the gate structure 2; a conductive material layer located within the via 12 being used as a via interconnecting structure 15, and the via interconnecting structure 15 being electrically connected to the source/drain contact plug 6; a conductive material layer within the trench 11 being used as an interconnecting wire 16, and the interconnecting wire 16 being electrically connected to the gate contact plug 14 and the via interconnecting structure 15.

In the forming method, the gate contact plug 14 is formed using a dual damascene process, that is, the gate contact plug 14, the via interconnecting structure 15, and the interconnecting wire 16 are formed in a same step, which facilitates formation of a multi-layer high-density metal wire, thereby making an integrated circuit more advanced and more efficient. In addition, an extending direction of the interconnecting wire 16 is generally perpendicular to an extending direction of the gate structure 2, and a position for forming the via 12 can be accurately positioned using the dual damascene process.

However, the dual damascene process imposes relatively high requirements for a mask material and an etching process, and therefore the process is relatively difficult and complicated. For example, in the step of forming the via 12, the forming method should meet the following conditions: in order to ensure that the hard mask layer 10 can function as a partial etching mask, the via etching process uses a relatively large etch selection ratio of the protective layer 7 to the mask layer 10. In addition, in order to ensure that the self-aligned stop layer 3 can perform a self-alignment function in the via etching process, the via etching process also uses a relatively large etch selection ratio of the protection layer 7 to the self-aligned stop layer 3. In the step of forming the gate contact 13, the following conditions should be met: in order to ensure that the hard mask layer 10 can function as a partial etch mask, the gate contact etching process uses a relatively large etch selection ratio of the self-aligned stop layer 3 to the hard mask layer 10. In addition, in order to ensure a protective effect of the protection layer 7 on the source/drain contact plug 6, the gate contact etching process also uses a relatively large etch selection ratio of the self-aligned stop layer 3 to the protection layer 7.

In an actual process, it is generally difficult for materials of the hard mask layer 10, the protection layer 7, and the self-aligned stop layer 3 to meet all of the foregoing conditions simultaneously. Therefore, a process for forming the gate contact 13 is relatively difficult, and correspondingly, the process window for forming the COAG is relatively small. For example, the hard mask layer 10 is generally made of titanium nitride, the self-aligned stop layer 3 is generally made of silicon nitride, and the protection layer 7 is generally made of silicon carbide. An etch selection ratio of either of the silicon nitride material and the silicon carbide material to the titanium nitride material is relatively large, and therefore it can be ensured that the hard mask layer 10 can function as a corresponding mask in the via etching process and the gate contact etching process; an etch selection ratio of the silicon nitride material to the silicon carbide material is also relatively large, and therefore it can be ensured that relatively few losses are caused to the protection layer 7 in the gate contact etching process. However, an etch selection ratio of the silicon carbide material to the silicon nitride material is relatively small, and therefore a loss is likely to be caused to the self-aligned stop layer 3 in the via etching process, and further the via interconnecting structure 15 is likely to be extremely close to the gate structure 2 that does not require an electrical connection, and a probability of a short circuit occurring between the via interconnecting structure 15 and the gate structure 2 is relatively high, causing reduction of the process window and a production yield.

To address the technical problems, in implementations of the present disclosure, the etch stop layer can define a lateral etch stop position of the gate contact etching process in the step of forming a gate contact, to prevent a loss from being caused to the source/drain contact plug in the gate contact etching process, thereby reducing difficulty in forming the gate contact. Subsequently, after a gate contact plug is formed within the gate contact, the etch stop layer can also define a space between the source/drain contact plug and the gate contact plug and achieve isolation between both, so that the gate contact plug can be formed between adjacent source/drain contact plugs while preventing a short circuit from occurring between the gate contact plug and the source/drain contact plug, which facilitates enlargement of a process window for forming a contact over active gate plug.

To assist in making the foregoing objectives, features, and advantages of implementations of the present disclosure more apparent and easier to understand, specific embodiments and implementations of the present disclosure are described in detail with reference to the accompanying figures below.

FIG. 8 to FIG. 18 are respective schematic structural diagrams of steps in one form of a method for forming a semiconductor structure according to the present disclosure.

Referring to 8, a base 50 is provided, a gate structure 51 being formed on the base 50, a source/drain doped layer 52 being formed within the base 50 on both sides of the gate structure 51, and an initial dielectric layer 53 being formed on the base 50 exposed from the gate structure 51, the initial dielectric layer 53 covering the top of the gate structure 51, a source/drain contact plug 54 being formed within the initial dielectric layer 53 on the top of the source/drain doped layer 52, and the source/drain contact plug 54 being electrically connected to the source/drain doped layer 52.

The base 50 is configured to provide a process platform for a manufacture procedure of a subsequent process.

In some implementations, the base 50 is configured to form a fin field effect transistor (FinFET). Therefore, the base includes a substrate 501 and a fin 502 protruding from the substrate 501. In other implementations, when the base is configured to form a planar field effect transistor, the base includes only a substrate correspondingly.

In some implementations, the substrate 501 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator. The substrate may be made of a material suitable for the process or easy to integrate.

In some implementations, the fin 502 is made of a material same as that of the substrate 501, and the fin 502 is made of silicon. In other implementations, the fin may also be made of a semiconductor material suitable for forming a fin, such as germanium, silicon germanium, silicon carbide, gallium arsenide, or indium gallium.

In some implementations, the substrate 501 exposed from the fin 502 is further formed with an isolation layer 55 covering a portion of a side wall of the fin 502. The isolation layer 55 is configured to perform isolation between adjacent devices.

In some implementations, the isolation layer 55 is made of silicon oxide. In other implementations, the isolation layer may also be made of other insulating materials such as silicon nitride or silicon oxynitride.

The gate structure 51 is configured to control opening or closing of a conductive channel when a semiconductor device operates.

In some implementations, the gate structure 51 is formed using a gate-last process, and the gate structure 51 is a metal gate structure correspondingly, and the gate structure 51 includes a high-k gate dielectric layer (not shown in the figure) and a gate electrode layer (not shown in the figure) on the high-k gate dielectric layer.

In some implementations, the high-k gate dielectric layer is made of a high-k dielectric material; where the high-k dielectric material refers to a dielectric material having a relative dielectric constant greater than a relative dielectric constant of silicon oxide. In particular, the high-k gate dielectric layer is made of $HfO_2$. In other implementations, the high-k gate dielectric layer may also be made of a material selected from $ZrO_2$, HfSiO, HfSiON, HfTaO, HfTiO, HfZrO, or $Al_2O_3$.

The gate electrode layer is made of Al, Cu, Ag, Au, Pt, Ni, Ti, or W. In some implementations, the gate electrode layer is made of W.

In some implementations, the gate structure 51 along an extending direction of the fin 502 and located on an edge of the fin 502 is used as a dummy gate, and correspondingly, a gate contact plug does not need to be formed on the top of the dummy gate subsequently.

In some implementations, a spacer 56 is further formed on a side wall of the gate structure 51. The spacer 56 is configured to define a region for forming the source/drain doped layer 52, and the spacer 56 is further configured to protect the side wall of the gate structure 51 in a manufacture procedure of the process.

The spacer 56 may be made of one or more of silicon oxide, silicon nitride, silicon oxynitride, silicon carbide, silicon oxycarbonitride, silicon oxycarbide, boron nitride, and carbon boron nitride, and the spacer 56 can be a single layer structure or a laminated structure. In some implementations, the spacer 56 is a laminated structure. In particular, the spacer 56 is an ONO (Oxide-Nitride-Oxide) structure, and the spacer 56 includes a first spacer (not shown in the figure) on the side wall of the gate structure 51, a second spacer (not shown in the figure) on a side wall of the first spacer, and a third spacer (not shown in the figure) on a side wall of the second spacer. Correspondingly, the first spacer is made of silicon oxide, the second spacer is made of silicon nitride, and the third spacer is made of silicon oxide.

In some implementations, the source/drain doped layer 52 is located within the fin 502 on both sides of the gate structure 51.

When a NMOS transistor is formed, the source/drain doped layer 52 includes a stress layer doped with an N-type ion, the stress layer being made of Si or SiC, and the stress layer providing a tensile stress function for a channel region of the NMOS transistor, thereby facilitating improvement of a carrier mobility ratio of the NMOS transistor, where the N-type ion is a P ion, an As ion, or an Sb ion. When a PMOS transistor is formed, the source/drain doped layer 52 includes a stress layer doped with a P-type ion, the stress layer being made of Si or SiGe, and the stress layer providing a tensile stress function for a channel region of the PMOS transistor, thereby facilitating improvement of a carrier mobility ratio of the PMOS transistor, where the P-type ion is a B ion, a Ga ion, or an In ion.

In some implementations, adjacent gate structures 51 share one source/drain doped layer 52.

In some implementations, a contact etch stop layer (CESL) 59 covering the side wall of the gate structure 51 and the base 50 exposed from the gate structure 51 is further formed on the base 50.

In an etching process for forming the source/drain contact plug 54, the contact etch stop layer 59 is configured to define a longitudinal etch stop position of the etching process, to reduce a probability of causing a damage to the source/drain doped layer 52 in the etching process. Therefore, the source/drain contact plug 54 also penetrates through the contact etch stop layer 59 on the source/drain doped layer 52.

In some implementations, the contact etch stop layer 59 is made of silicon nitride.

In some implementations, a bottom dielectric layer 57 exposing a portion of the side wall of the gate structure 51 is further formed on the base 50. In particular, the bottom dielectric layer 57 exposes the top of the source/drain doped layer 52. The bottom dielectric layer 57 is configured to achieve isolation between adjacent devices and between adjacent gate structures 51.

For this purpose, the bottom dielectric layer 57 is made of a dielectric material such as one or more of silicon oxide, silicon nitride, silicon oxynitride, silicon oxycarbide, silicon carbonitride, and silicon oxycarbonitride. In some implementations, the bottom dielectric layer 57 is made of silicon oxide.

In some implementations, the top dielectric layer 60 covering the bottom dielectric layer 57 and exposing the top of the gate structure 51 is further formed on the base 50.

The top dielectric layer 60 and the bottom dielectric layer 57 constitutes an interlayer dielectric (ILD), thereby achieving isolation between adjacent devices. The top dielectric layer 60 is further configured to provide a process platform for forming the source/drain contact plug 54.

For this purpose, the top dielectric layer 60 is made of a dielectric material such as one or more of silicon oxide, silicon nitride, silicon oxynitride, silicon oxycarbide, silicon carbonitride, and silicon oxycarbonitride. In some implementations, the top dielectric layer 60 is made of a material same as that of the bottom dielectric layer 57, and the top dielectric layer 60 is made of silicon oxide.

The initial dielectric layer 53 is configured to achieve electrical isolation between the source/drain contact plug 54 and a subsequent gate contact plug, and the initial dielectric layer 53 is further configured to provide a process platform for forming the source/drain contact plug 54 and forming the gate contact plug subsequently.

For this purpose, the initial dielectric layer 53 is also made of a dielectric material. In some implementations, in order to improve process compatibility, the initial dielectric layer 53 is made of a material same as that of the top dielectric layer 60, and the initial dielectric layer 53 is made of silicon oxide.

The source/drain contact plug 54 is configured to achieve an electrical connection between the source/drain doped layer 52 and other interconnecting structures or an external circuit.

In some implementations, the source/drain contact plug 54 is made of copper. A relatively low resistivity of copper facilitates improvement of a signal delay of a back end of line RC and improvement of a processing speed of a chip, and also facilitates reduction of a resistance of the source/drain contact plug 54, thereby reducing power consumption correspondingly. In other implementations, the contact plug may also be made of tungsten or cobalt.

The step of forming the source/drain contact plug 54 generally includes: etching the initial dielectric layer 53 and an interlayer dielectric between side walls of the adjacent gate structures 51 to form a source/drain contact (not shown in the figure) exposing the top of the source/drain doped layer 52, a conductive material layer (not shown in the figure) being formed within the source/drain contact, and the conductive material layer further covering the top of the initial dielectric layer 53; flattening the conductive material layer using the top surface of the initial dielectric layer 53 as a stop position, and using a remainder of the conductive material layer as the source/drain contact plug 54.

In some implementations, a self-aligned stop layer 58 is further formed on the side wall of the gate structure 51 exposed from the bottom dielectric layer 57. In the etching process for forming the source/drain contact plug 54, self-aligned stop layers 58 on side walls of the adjacent gate structures 51 are configured to define etch stop positions along a direction perpendicular to the side walls of the gate structures 51, so that self-alignment of the etching process is achieved, thereby forming the source/drain contact plug 54. Correspondingly, the source/drain contact plug 54 is a self-aligned contact plug.

The self-aligned stop layer 58 may be made of silicon nitride, aluminium oxide, aluminium nitride, or NDC (Nitride Doped Carbon). There is a relatively large etch selection ration between both the interlayer dielectric and the initial dielectric layer 53 and the material, so that it can be ensured that the self-aligned stop layer 58 can achieve a corresponding process effect. In some implementations, the self-aligned stop layer 58 is made of silicon nitride. Silicon nitride is a material commonly used in a semiconductor process that facilitates improvement of process compatibility.

In other implementations, a self-aligned stop layer may also be formed on the top of the gate structure. Correspondingly, the self-aligned stop layer and the spacer can achieve self-alignment of an etching process for forming the source/drain contact in the etching process.

Figure 9:
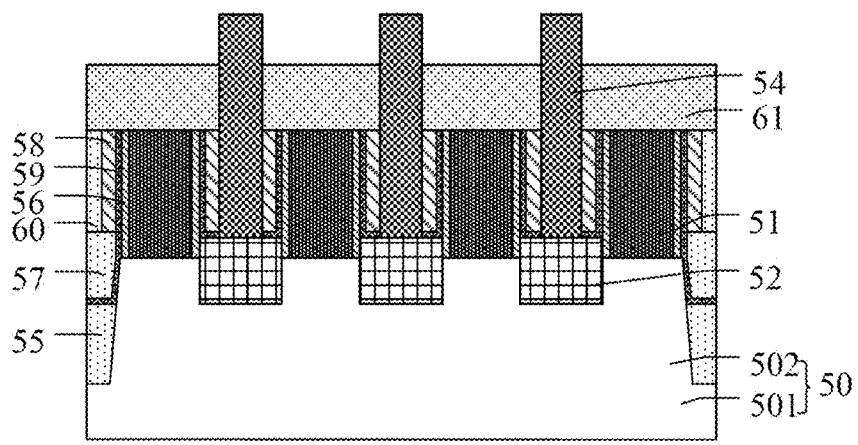

Referring to FIG. 9, a portion of a thickness of the initial dielectric layer 53 is removed to form a dielectric layer 61 that exposes a portion of a side wall of the source/drain contact plug 54.

The dielectric layer 61 exposes the portion of the side wall of the source/drain contact plug 54, thereby preparing for forming an etch stop layer subsequently.

A distance from the top of the dielectric layer 61 to the top of the source/drain contact plug 54 should be neither excessively small nor excessively large. If the distance is excessively small, a height of the source/drain contact plug 54 exposed from the dielectric layer 61 is excessively small, and a height of an etch stop layer is extremely small correspondingly after the etch stop layer is subsequently formed on the side wall of the source/drain contact plug 54 exposed from the dielectric layer 61, and it is difficult for the etch stop layer to define a lateral stop position of a subsequent gate contact etching process. If the distance is excessively large, the initial dielectric layer 53 is removed by an excessively amount correspondingly, which is likely to increase a process risk and reduce stability. For example, etch rate uniformity is likely to be relatively poor, causing a relatively poor flatness of the top surface of the dielectric layer 61. In addition, a thickness of the dielectric layer 61 is likely to be excessively small, and a height of a gate contact plug electrically connected to the gate structure 51 is also excessively small after the gate contact plug is formed within the dielectric layer 61. For this purpose, in some implementations, the distance from the top of the dielectric layer 61 to the top of the source/drain contact plug 54 is from 50 angstroms to 300 angstroms.

In some implementations, the portion of the thickness of the initial dielectric layer 53 is removed through etching using a dry etching process. The dry etching process has anisotropic etching characteristics, which facilitates accurate control of an amount for etching the initial dielectric layer 53, so that the distance from the top of the dielectric layer 61 to the top of the source/drain contact plug 54 meets process requirements, and facilitates improvement of profile quality of the top surface of the dielectric layer 61.

Figure 10:
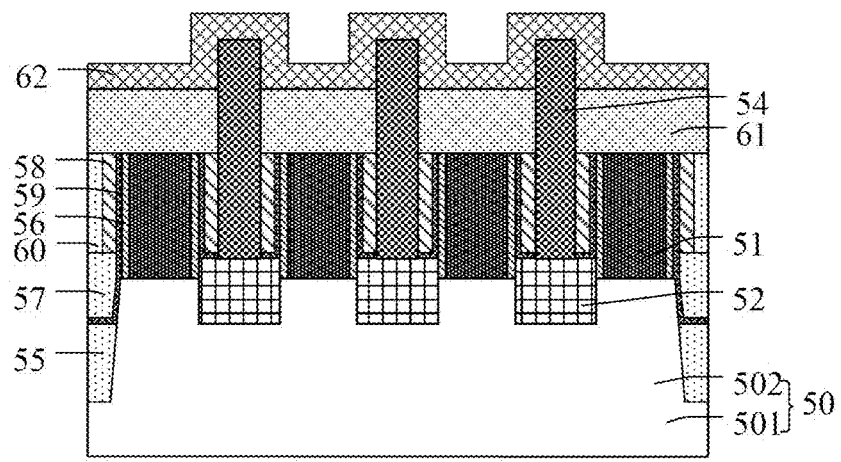

Referring to FIG. 10, an etch stop layer 62 is formed at least on the side wall of the source/drain contact plug 54 exposed from the dielectric layer 61.

The etch stop layer 62 can define a lateral etch stop position of a subsequent etching process for forming a gate contact in the etching process, to prevent a loss from being caused to the source/drain contact plug 54 in the gate contact etching process, thereby reducing difficulty in forming the gate contact. Correspondingly, after the gate contact plug is formed within the gate contact, the etch stop layer 62 can define a space between the source/drain contact plug 54 and the gate contact plug and achieve isolation between both. Therefore, with the etch stop layer 62, the gate contact plug can be formed between adjacent source/drain contact plugs 54 while preventing a short circuit from occurring between the gate contact plug and the source/drain contact plug 54 subsequently, thereby enlarging a process window for forming a contact over active gate. In addition, compared with a solution of forming the COAG using a dual damascene scheme, the process in some implementations has simple steps, and the process is less difficult, facilitating simplification of a flow.

The lateral etch stop position refers to an etch stop position along a direction parallel to a surface of the base 50 in etching steps of forming the gate contact subsequently.

In order to ensure that the etch stop layer 62 can define the lateral etch stop position of the gate contact etching process, the etch stop layer 62 is made of a material having a relatively large etch selection ratio to the material of the dielectric layer 61. The etch stop layer 62 may be made of silicon nitride or silicon carbide. The etch selection ratio of the dielectric layer 61 to the material is relatively large, helping ensure a function of the etch stop layer 62 to define the lateral etch stop position.

In some implementations, the etch stop layer 62 is made of silicon nitride. The silicon nitride material is a material commonly used in a semiconductor process with high process compatibility.

In other implementations, when a self-aligned stop layer is formed on the top of the gate structure, after a dielectric layer on the top of the gate structure is etched, a subsequent step of forming a gate contact further includes: etching the self-aligned stop layer on the top of the gate structure. In order to ensure the function of the etch stop layer to define the lateral etch stop position of the gate contact etching process, in the step of etching the self-aligned stop layer, an etch selection ratio of a material of the self-aligned stop layer to a material of the etch stop layer is greater than or equal to 5:1.

In some implementations, the etch stop layer 62 conformally covers the top and side wall of the source/drain contact plug 54 exposed from the dielectric layer 61, as well as the top of the dielectric layer 61. An etch stop layer 62 located on the top of the source/drain contact plug 54 can protect the top of the source/drain contact plug 54 in the subsequent process; an etch stop layer 62 located on the top of the dielectric layer 61 can define a stop position of a subsequent flattening process for forming the gate contact plug in the flattening process.

In some implementations, the etch stop layer 62 is formed using an atomic layer deposition (ALD) process. The atomic layer deposition process includes performing multiple atomic layer deposition cycles to form a film of a required thickness. Using the atomic layer deposition process facilitates increase of thickness uniformity and a density of the etch stop layer 62, and a thickness of the etch stop layer 62 can be controlled accurately. Furthermore, the atom layer deposition process has good gap filling performance and step coverage, improving a conformal covering capability of the etch stop layer 62 on the top of the dielectric layer 61 and on the top and the side walls of the source/drain contact plug 54 exposed from the dielectric layer 61 correspondingly.

The etch stop layer 62 should be neither excessively thin nor excessively thick. If the etch stop layer 62 is excessively thin, not only a thickness of the etch stop layer 62 is likely to be less than an overlay shift of a subsequent gate contact etching process, but also the etch stop layer 62 is likely to be removed prematurely in the subsequent gate contact etching process, and both of the two cases can lead to a poor effect of the etching stop layer 62 to define the lateral stop position of the gate contact etching process. If the etch stop layer 62 is excessively thick, not only a waste of process times and materials is likely to be caused, but also remaining space between etch stop layers 62 on the side walls of adjacent source/drain contact plugs 54 is excessively small, or the etch stop layers 62 on the side walls of the adjacent source/drain contact plugs 54 are likely to contact with each other, increasing process difficulty in forming the gate contact subsequently. For this purpose, in some implementations, the etch stop layer 62 has a thickness from 50 angstroms to 300 angstroms.

Figure 11:
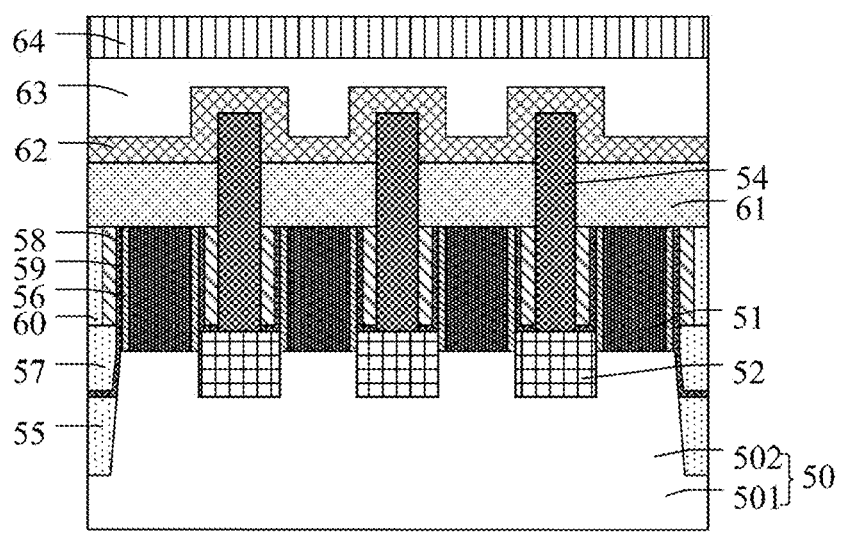
Figure 12:
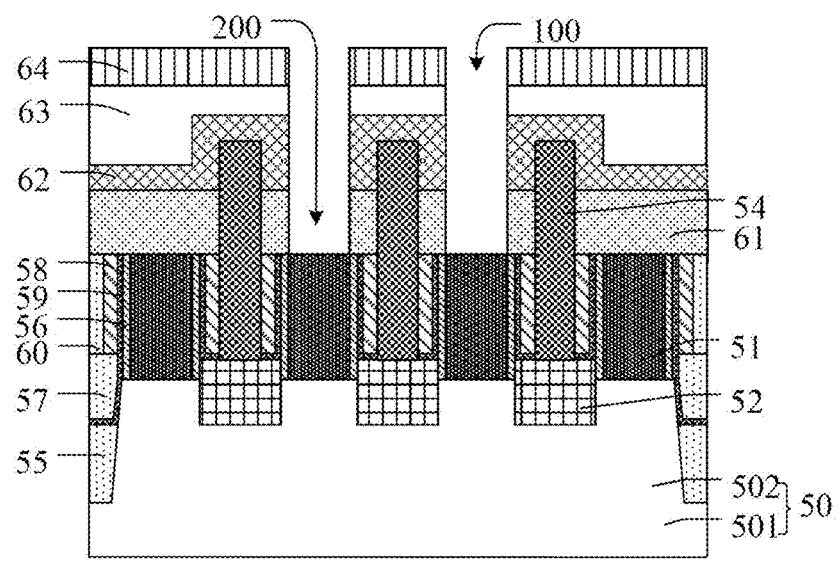

Referring to FIG. 11 to FIG. 12, the dielectric 61 layer on the top of the gate structure 51 is etched using the etch stop layers 62 on the side walls of the adjacent source/drain contact plugs 54 as lateral etch stop positions, to form a gate contact 200 exposing the top of the gate structure 51 (shown in FIG. 12).

In the step of etching the dielectric layer 61 on the top of the gate structure 51, the etch stop layer 62 can define a lateral etch stop position of the etching process, and therefore, even if there is an overlay shift in the gate contact etching process, it is difficult to cause a loss to the source/drain contact plug 54. Therefore, the gate contact 200 can be prevented from exposing the source/drain contact plug 54, so that a short circuit is prevented from occurring between gate contact plug and the source/drain contact plug 54 subsequently, thereby reducing the process difficulty in forming the gate contact 200. In addition, the gate contact can be formed between the adjacent source/drain contact plugs 54, that is, the gate contact plug can be formed over a gate structure 51 in an active region subsequently, thereby enlarging the process window for forming the contact over active gate. In addition, compared with a solution of forming a COAG using a dual damascene scheme, the process in some implementations has simple steps, and the process is less difficult, facilitating simplification of a flow and cost saving.

In some implementations, the step of forming the gate contact 200 includes:

forming a mask layer 64 covering the etch stop layer 62 (shown in FIG. 11). In some implementations, the mask layer 64 is made of photoresist.

In some implementations, before the mask layer 64 is formed, the step further includes: forming a flattened layer 63 covering the etch stop layer 62. The flattened layer 63 is configured to provide a flat surface, to prepare for forming the mask layer 64.

In some implementations, the flattened layer 63 is made of spin on carbon (SOC). Accordingly, the flattened layer 63 is formed using a spin coating process.

As shown in FIG. 12, the mask layer 64 is patterned to form a mask opening 100 in the mask layer 64; a dielectric layer 61 exposed from the mask opening 100 is etched using the mask layer 64 as a mask and using the etch stop layers 62 on the side walls of the adjacent source/drain contact plugs 54 as lateral stop positions, to form the gate contact 200.

In some implementations, the mask layer 64 is made of photoresist, and a process for patterning the mask layer 64 is a photolithography process correspondingly.

In some implementations, the dielectric layer 61 exposed from the mask opening 100 is etched using a dry etching process. The dry etching process is an anisotropic etching process and has a relatively good profile control characteristics, which facilitates enabling a profile of the gate contact 200 to meet process requirements.

In some implementations, before the dielectric layer 61 exposed from the mask opening 100 is etched, the step further includes: etching the flattened layer 63 exposed from the mask opening 100 and the etch stop layer 62 on the top of the dielectric layer 61 on the top of the gate structure 51 sequentially.

In particular, the flattened layer 63, the etch stop layer 62, and the dielectric layer 61 are etched in a same etching machine by adjusting an etching gas type and a process parameter of the dry etching process.

Figure 13:
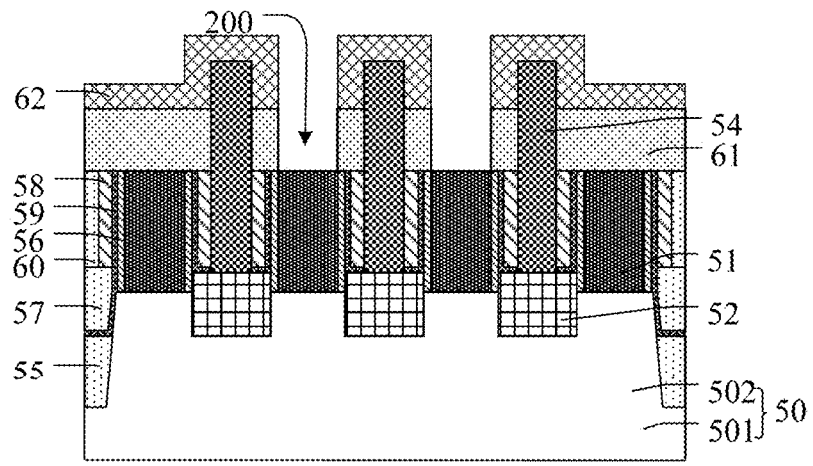
Figure 14:
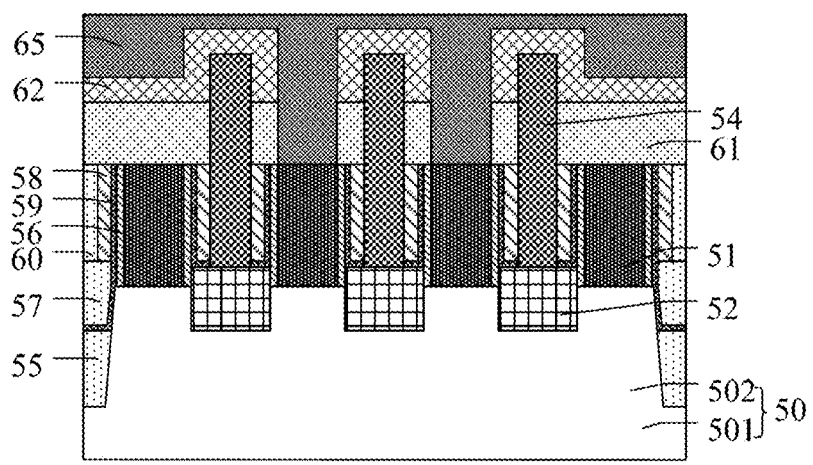

With reference to and referring to FIG. 13, after the gate contact 200 is formed, the step further includes: removing the mask layer 64 and the flattened layer 63. In particular, the mask layer 64 and the flattened layer 63 are removed using an ashing process.

In other implementations, when a self-aligned stop layer is formed on the top of the gate structure, the step of forming the gate contact further includes: etching the self-aligned stop layer after the dielectric layer on the top of the gate structure is etched.

Referring to FIG. 14 to FIG. 18, a gate contact plug 66 (shown in FIG. 18) is formed within the gate contact 200, the gate contact plug 66 being electrically connected to the gate structure 51. The gate contact plug 66 is configured to achieve an electrical connection of the gate structure 51 to other interconnecting structures or an external circuit.

It can be learned from the above that a probability that the gate contact 200 exposes the source/drain contact plug 54 is relatively small. Therefore, the gate contact plug 66 can be formed between the adjacent source/drain contact plugs 54, and a probability of a short circuit occurring between the gate contact plug 66 and the source/drain contact plug 54 is relatively low, thereby enlarging the process window for forming the contact over active gate (COAG).

Compared with a solution in which the gate contact plug is located over a gate structure in an isolation region, the gate contact plug 66 described in some implementations is formed over the gate structure 51 in the active region, and therefore a portion of the gate structure 51 located in the isolation region is omitted, thereby facilitating saving of a chip area and further reduction of a chip size.

In some implementations, the gate contact plug 66 is made of copper. A relatively low resistivity of copper facilitates improvement of a signal delay of a back end of line RC and improvement of a processing speed of a chip, and also facilitates reduction of a resistance of the gate contact plug 66, thereby reducing power consumption correspondingly. In other implementations, the gate contact plug may also be made of tungsten or cobalt.

Figure 15:
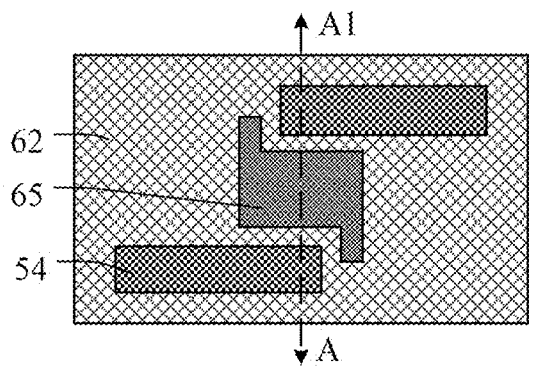
Figure 16:
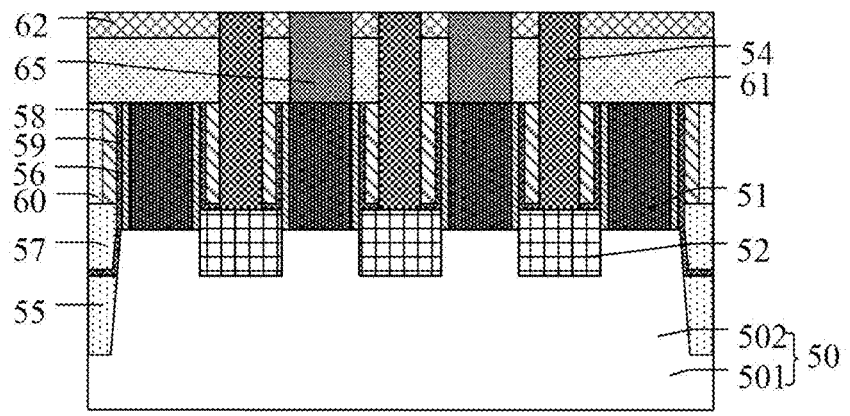

In some implementations, the step of forming the gate contact plug 66 includes: forming a conductive material layer 65 filling in the gate contact 200, the conductive material layer 65 further covering the source/drain contact plug 54 and the etch stop layer 62 on the top of the dielectric layer 61 (shown in FIG. 14); performing a first flattening treatment on the conductive material layer 65 using the top surface of the etch stop layer 62 on the top of the dielectric layer 61 as a stop position (shown in FIG. 15 and FIG. 16, FIG. 15 is the top view, and FIG. 16 is a profile view of FIG. 15 along a secant line AA1).

In some implementations, the conductive material layer 65 is formed using an electroplating (ECP) process. In other implementations, the conductive material layer may also be formed using a chemical vapor deposition process.

In some implementations, the first flattening treatment is performed using a chemical-mechanical polishing process, which facilitates improvement of a flatness of the top surface of a subsequent gate contact plug. In the step of performing the first flattening treatment, a flattening treatment is further performed on the etch stop layers 62 on the top surface and the side wall of the source/drain contact plug 54 as well as the source/drain contact plug 54.

In some implementations, in the step of performing the first flattening treatment, the etch stop layer 62 on the top of the dielectric layer 61 can define a stop position for the flattening treatment, which facilitates improvement of flatness of the tops of the conductive material layer 65 and the source/drain contact plug 54 after the first flattening treatment.

Figure 17:
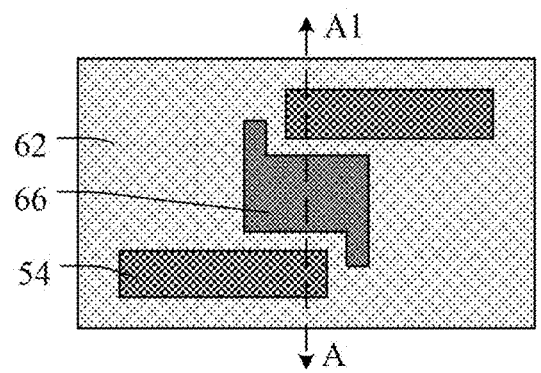
Figure 18:
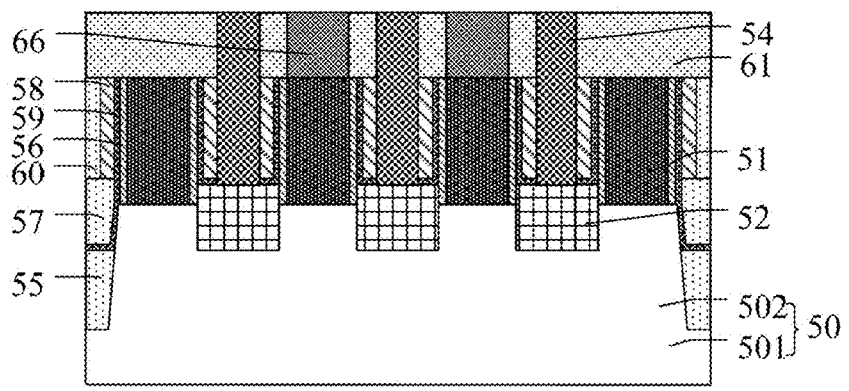

It should be noted that, with reference to and referring to FIG. 17 to FIG. 18, FIG. 17 is the top view based on FIG. 15, and FIG. 18 is a profile view of FIG. 17 along a secant line AA1, and the step of forming the gate contact plug 66 further includes: performing a second flattening treatment on the conductive material layer 65 using the top surface of the dielectric layer 61 as a stop position after the first flattening treatment is performed, a remainder of the conductive material layer 65 being used as the gate contact plug 66. In the step of performing the second flattening treatment, the etch stop layer 62 on the top of the dielectric layer 61 is removed.

For ease of illustration and description, only one gate contact plug 66 and two source/drain contact plugs 54 adjacent to the gate contact plug 66 are shown in FIG. 17. In other implementations, according to an actual process, there may also be other numbers of gate contact plugs and source/drain contact plugs.

In some implementations, an example in which the gate contact plug 66 surrounds a portion of the side wall of the source/drain contact plug 54 is used. In other implementations, according to actual process requirements, the gate contact plug and the source/drain contact plug may also be of other shapes.

A dielectric constant of the material of the etch stop layer 62 is generally greater than a dielectric constant of the material of the dielectric layer 61, and the etch stop layer 62 on the top of the dielectric layer 61 is removed through the second flattening treatment, which facilitates reduction of an influence of the etch stop layer 62 on a parasitic capacitance between interconnecting structures.

In some implementations, in the step of performing the second flattening treatment, flattening treatment is further performed on the source/drain contact plug 54.

In particular, the second flattening treatment is performed using a chemical-mechanical polishing process, which facilitates improvement of flatness and height consistency of top surfaces of the source/drain contact plug 54, the gate contact plug 66, and the dielectric layer 61.

In some implementations, an example in which the etch stop layer 62 on the top of the dielectric layer 61 is removed is used. In other implementations, as the etch stop layer is made of a dielectric material, according to actual process requirements, the second flattening treatment may not be performed, omitting a step of removing the etch stop layer on the top of the dielectric layer. Correspondingly, after the first flattening treatment, a remainder of the conductive material layer is used as the gate contact plug.

Correspondingly, the present disclosure further provides a semiconductor structure. Referring to FIG. 13, a schematic structural diagram of an embodiment of a semiconductor structure according to the present disclosure is shown.

The semiconductor structure includes: a base 50; a gate structure 51 located on the base 50; a source/drain doped layer 52 located within the base 50 on both sides of the gate structure 51; a dielectric layer 61 located on the base 50 exposed from the gate structure 51, the dielectric layer 61 covering the top of the gate structure 51; a source/drain contact plug 54 located within the dielectric layer 61 on the top of the source/drain doped layer 52, the source/drain contact plug 54 being electrically connected to the source/drain doped layer 52, and the top of the source/drain contact plug 54 being higher than the top of the dielectric layer 61; an etch stop layer 62 located at least on a side wall of the source/drain contact plug 54 exposed from the dielectric layer 61; a gate contact 200 located within a dielectric layer 61 between etch stop layers 62 on side walls of the adjacent source/drain contact plugs 54, the gate contact 200 exposing the top of the gate structure 51.

The gate contact 200 is configured to provide a spatial position for forming a gate contact plug.

A manufacture procedure of forming the gate contact 200 generally includes the step of etching the dielectric layer 61 on top of the gate structure 51, the etch stop layer 62 can define a lateral etch stop position of the etching process, and even if there is an overlay shift in the gate contact etching process, it is difficult to cause a loss to the source/drain contact plug 54, thereby reducing difficulty in forming the gate contact. Correspondingly, after the gate contact plug is formed in the gate contact 200 subsequently, the etch stop layer 62 can define a space between the source/drain contact plug 54 and the gate contact plug and achieve isolation between both, thereby preventing a short circuit from occurring between the gate contact plug and the source/drain contact plug 54, while enabling the gate contact 200 to be formed between the adjacent source/drain contact plugs 54, that is, the gate contact plug can be formed over the gate structure 51 in the active region, thereby enlarging the process window for forming the contact over active gate.

The lateral etch stop position refers to an etch stop position along the direction parallel to the surface direction of the base 50 in the etching step of forming the gate contact 200.

In some implementations, the semiconductor structure is a fin field effect transistor. Therefore, the base includes a substrate 501 and a fin 502 protruding from the substrate 501. In other implementations, when the semiconductor structure is a planar field effect transistor, the base includes only the substrate correspondingly.

In some implementations, the substrate 501 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on the insulator. The substrate may be made of a material suitable for the process or easy to integrate.

In some implementations, the fin 502 is made of a material same as that of the substrate 501, and the fin 502 is made of silicon. In other implementations, the fin may also be made of a semiconductor material suitable for forming a fin, such as germanium, silicon germanium, silicon carbide, gallium arsenide, or indium gallium.

The semiconductor structure further includes an isolation layer 55 located on the substrate 501 exposed from the fin 502, the isolation layer 55 covering a portion of a side wall of the fin 502. The isolation layer 55 is configured to perform isolation between adjacent devices.

In some implementations, the isolation layer 55 is made of silicon oxide. In other implementations, the isolation layer may also be made of other insulating materials such as silicon nitride or silicon oxynitride.

In some implementations, the gate structure 51 is a metal gate structure, and the gate structure 51 includes a high-k gate dielectric layer (not shown in the figure) and a gate electrode layer located on the high-k gate dielectric layer (not shown in the figure).

In some implementations, the high-k gate dielectric layer is made of a high-k dielectric material. In particular, the high-k gate dielectric layer is made of $HfO_2$. In other implementations, the high-k gate dielectric layer may also be made of a material selected from $ZrO_2$, HfSiO, HfSiON, HfTaO, HfTiO, HfZrO, or $Al_2O_3$.

The gate electrode layer is made of Al, Cu, Ag, Au, Pt, Ni, Ti, or W. In some implementations, the gate electrode layer is made of W.

The semiconductor structure further includes a spacer 56 located on the side wall of the gate structure 51. The spacer 56 is configured to define a region for forming the source/drain doped layer 52, and the spacer 56 is further configured to protect the side wall of the gate structure 51. The spacer 56 may be made of one or more of silicon oxide, silicon nitride, silicon oxynitride, silicon carbide, silicon oxycarbonitride, silicon oxycarbide, boron nitride, and carbon boron nitride, and the spacer 56 can be a single layer structure or a laminated structure. In some implementations, the spacer 56 is a laminated structure. In particular, the spacer 56 is an ONO structure.

In some implementations, the source/drain doped layer 52 is located within the fin 502 on both sides of the gate structure 51.

When the semiconductor structure is a NMOS transistor, the source/drain doped layer 52 includes a stress layer doped with an N-type ion, the stress layer being made of Si or SiC, and the stress layer providing a tensile stress function for a channel region of the NMOS transistor, thereby facilitating improvement of a carrier mobility ratio of the NMOS transistor, where the N-type ion is a P ion, an As ion, or an Sb ion. When the semiconductor structure is a PMOS transistor, the source/drain doped layer 52 includes a stress layer doped with a P-type ion, the stress layer being made of Si or SiGe, and the stress layer providing a tensile stress function for a channel region of the PMOS transistor, thereby facilitating improvement of a carrier mobility ratio of the PMOS transistor, where the P-type ion is a B ion, a Ga ion, or an In ion.

In some implementations, the adjacent gate structures 51 share one source/drain doped layer 52.

In some implementations, the gate structure 51 along an extending direction of the fin 502 and located on an edge of the fin 502 is used as a dummy gate. Correspondingly, no gate contact is formed on the top of the dummy gate.

In some implementations, the semiconductor structure further includes: a contact etch stop layer 59 covering the side wall of the gate structure 51, and the base 50 exposed from the gate structure 51 and the source/drain contact plug 54.

The contact etch stop layer 59 is configured to define a longitudinal etch stop position of an etching process for forming the source/drain contact plug 54 in the source/drain contact etching process, to reduce a probability of causing a damage to the source/drain doped layer 52 in the etching process. In some implementations, the contact etch stop layer 59 is made of silicon nitride.

In some implementations, the semiconductor structure further includes: a bottom dielectric layer 57 covering a portion of the side wall of the gate structure 51. In particular, the bottom dielectric layer 57 exposes the top of the source/drain doped layer 52.

The bottom dielectric layer 57 is configured to achieve isolation between adjacent devices. For this purpose, the bottom dielectric layer 57 is made of a dielectric material such as one or more of silicon oxide, silicon nitride, silicon oxynitride, silicon oxycarbide, silicon carbonitride, and silicon oxycarbonitride. In some implementations, the bottom dielectric layer 57 is made of silicon oxide.

In some implementations, the semiconductor structure further includes the top dielectric layer 60 covering the bottom dielectric layer 57 and exposing the top of the gate structure 51. The top dielectric layer 60 and the bottom dielectric layer 57 constitute an interlayer dielectric, thereby achieving isolation between adjacent devices.

For this purpose, the top dielectric layer 60 is made of a dielectric material such as one or more of silicon oxide, silicon nitride, silicon oxynitride, silicon oxycarbide, silicon carbonitride, and silicon oxycarbonitride. In some implementations, the top dielectric layer 60 is made of a material same as that of the bottom dielectric layer 57, and the top dielectric layer 60 is made of silicon oxide.

The dielectric layer 61 is configured to achieve electrical isolation between the source/drain contact plug 54 and the gate contact plug, and the dielectric layer 61 is also configured to provide a process platform for forming the source/drain contact plug 54 and the gate contact 200.

For this purpose, the dielectric layer 61 is also made of a dielectric material. In some implementations, in order to improve process compatibility, the dielectric layer 61 is made of a material same as that of the top dielectric layer 60, which is silicon oxide.

A distance from the top of the dielectric layer 61 to the top of the source/drain contact plug 54 should be neither excessively small nor excessively large. If the distance is excessively small, a height of the source/drain contact plug 54 exposed from the dielectric layer 61 is excessively small, and a height of the etch stop layer 62 located on the side wall of the source/drain contact plug 54 exposed from the dielectric layer 61 is excessively small correspondingly, and it is difficult for the etch stop layer 62 to define the lateral stop position of the gate contact etching process. If the distance is excessively large, a thickness of the dielectric layer 61 is excessively small correspondingly, and a height of the gate contact plug is also excessively small after the gate contact plug is formed within the gate contact 200 subsequently. For this purpose, in some implementations, the distance from the top of the dielectric layer 61 to the top of the source/drain contact plug 54 is from 50 angstroms to 300 angstroms.

The source/drain contact plug 54 is configured to achieve an electrical connection between the source/drain doped layer 52 and other interconnecting structures or an external circuit.

In some implementations, the source/drain contact plug 54 is made of copper, which facilitates improvement of a signal delay of a back end of line RC and improvement of a processing speed of a chip, and also facilitates reduction of a resistance of the source/drain contact plug 54, reducing power consumption correspondingly. In other implementations, the contact plug may also be made of tungsten or cobalt.

In some implementations, the semiconductor structure further includes: a self-aligned stop layer 58 located on the side wall of the gate structure 51 exposed from the bottom dielectric layer 57.

In the source/drain contact etching process for forming the source/drain contact plug 54, self-aligned stop layers 58 on the side walls of the adjacent gate structures 51 are configured to define etch stop positions along a direction perpendicular to the side walls of the gate structures 51, so that self-alignment of the etching process is achieved, thereby forming the source/drain contact plug 54. Correspondingly, the source/drain contact plug 54 is a self-aligned contact (SAC) plug.

The self-aligned stop layer 58 may be made of silicon nitride, aluminium oxide, aluminium nitride, or NDC. There is a relatively large etch selection ratio between either of the materials of interlayer dielectric layer or the initial dielectric layer 53 and the material, so that it can be ensured that the self-aligned stop layer 58 can achieve a respective process effect. In some implementations, the self-aligned stop layer 58 is made of silicon nitride. Silicon nitride is a material commonly used in a semiconductor process that facilitates improvement of process compatibility.

In other implementations, the self-aligned stop layer may be further located on the top of the gate structure. Correspondingly, the self-aligned stop layer and the spacer can achieve self-alignment of the source/drain contact etching process.

The etch stop layer 62 is configured to define an etch stop position along a direction perpendicular to the side wall of the gate structure 51 in an etching process for forming the gate contact 200.

In order to ensure that the etch stop layer 62 can define a lateral etch stop position of the gate contact etching process, the etch stop layer 62 is made of a material having a relatively large etch selection ratio to the material of the dielectric layer 61.

The etch stop layer 62 may be made of silicon nitride or silicon carbide. The etch selection ratio of the dielectric layer 61 to the material is relatively large, which helps ensure a function of the etch stop layer 62 to define the lateral etch stop position. In some implementations, the etch stop layer 62 is made of silicon nitride. The silicon nitride material is a material commonly used in a semiconductor process with high process compatibility.

In other implementations, when the semiconductor structure includes a self-aligned stop layer located on the top of the gate structure, correspondingly, in the step of forming the gate contact, after the dielectric layer on the top of the gate structure is etched, the step further includes: etching the self-aligned stop layer on the top of the gate structure. In some implementations, in order to ensure the function of the etch stop layer to define the lateral etch stop position of the gate contact etching process, the material of the etch stop layer further needs to meet the following: in the step of etching the self-aligned stop layer, an etch selection ratio of the material of the self-aligned stop layer to the material of the etch stop layer is greater than or equal to 5:1.

In some implementations, the etch stop layer 62 conformally covers the top and side wall of the source/drain contact plug 54 exposed from the dielectric layer 61, as well as the top of the dielectric layer 61.

The etch stop layer 62 located on the top of the source/drain contact plug 54 can protect the top of the source/drain contact plug 54 in a manufacture procedure of the process; the etch stop layer 62 located on the top of the dielectric layer 61 can define a stop position of a flattening process in which the gate contact plug is formed subsequently in the flattening process.

The etch stop layer 62 should be neither excessively thin nor excessively thick. If the etch stop layer 62 is excessively thin, not only a thickness of the etch stop layer 62 is likely to be less than an overlay shift of the etching process for forming the gate contact 200, but also the etch stop layer 62 is likely to be removed prematurely in the etching process, and both the two cases may reduce an effect of the etching stop layer 62 to define the lateral stop position of the gate contact etching process. If the etch stop layer 62 is excessively thick, not only a waste of process times and materials is likely to be caused, but also remaining space between the etch stop layers 62 on the side walls of adjacent source/drain contact plugs 54 is likely to be excessively small, or the etch stop layers 62 on the side walls of the adjacent source/drain contact plugs 54 are likely to contact with each other, increasing process difficulty in forming the gate contact 200. For this purpose, in some implementations, the etch stop layer 62 has a thickness from 50 angstroms to 300 angstroms.

The semiconductor structure may be formed using forming method described in the foregoing implementations, or may be formed using other forming methods. For detailed description of the semiconductor structure in some implementations, reference may be made to the corresponding descriptions in the foregoing implementations, and details are not described again in some implementations.

Although the present disclosure is disclosed above, the present disclosure is not limited thereto. Various changes and modifications may be made by a person skilled in the art without departing from the spirit and scope of the present disclosure, and thus the scope of the present disclosure should be subject to the scope defined by the claims.

What is claimed is:

1. A method for forming a semiconductor structure, comprising:
    providing a base, a gate structure being formed on the base, a source/drain doped layer being formed within the base on both sides of the gate structure, an initial dielectric layer being formed on the base exposed from the gate structure, the initial dielectric layer covering a top of the gate structure, a-source/drain contact plugs being formed within the initial dielectric layer on a top of the source/drain doped layer, the source/drain contact plugs being electrically connected to the source/drain doped layer;
    removing a portion of a thickness of the initial dielectric layer to form a dielectric layer and expose a portion of a side wall of each of the source/drain contact plugs;
    forming an etch stop layer on at least the side wall of each of the source/drain contact plugs exposed from the dielectric layer;
    etching the dielectric layer on the top of the gate structure using the etch stop layer on the side walls of the source/drain contact plugs as lateral etch stop positions, to form a gate contact opening exposing the top of the gate structure;
    forming a gate contact plug within the gate contact opening, the gate contact plug being electrically connected to the gate structure.

2. The method for forming a semiconductor structure according to claim 1, wherein in the step of forming the etch stop layer, the etch stop layer conformally covers the top and side walls of the source/drain contact plugs exposed from the dielectric layer as well as the top of the dielectric layer.

3. The method for forming a semiconductor structure according to claim 2, wherein the step of forming the gate contact plug comprises:
    forming a conductive material layer filling the gate contact opening, the conductive material layer further covering the source/drain contact plugs and the etch stop layer on the top of the dielectric layer; and
    performing a first flattening treatment on the conductive material layer using a top surface of the etch stop layer on a top of the dielectric layer as a stop position.

4. The method for forming a semiconductor structure according to claim 3, wherein the step of forming the gate contact plug further comprises:
    performing a second flattening treatment on the conductive material layer and the etch stop layer using the top surface of the dielectric layer as the stop position, after the first flattening treatment is performed.

5. The method for forming a semiconductor structure according to claim 3, wherein the first flattening treatment is performed using a chemically mechanical grinding process.

6. The method for forming a semiconductor structure according to claim 4, wherein the second flattening treatment is performed using a chemically mechanical grinding process.

7. The method for forming a semiconductor structure according to claim 1, wherein in the step of forming the dielectric layer, a distance from the top of the dielectric layer to the top of the source/drain contact plugs is from 50 angstroms to 300 angstroms.

8. The method for forming a semiconductor structure according to claim 1, wherein in the step of forming the etch stop layer, the etch stop layer has a thickness from 50 angstroms to 300 angstroms.

9. The method for forming a semiconductor structure according to claim 1, wherein the step of forming the gate contact comprises:
    forming a mask layer covering the etch stop layer;
    patterning the mask layer to form a mask opening in the mask layer;
    etching the dielectric layer exposed from the mask opening using the mask layer as a mask and using the etch stop layer on the side walls of the source/drain contact plugs as lateral etch stop positions, to form the gate contact opening; and
    after the gate contact opening is formed, removing the mask layer.

10. The method for forming a semiconductor structure according to claim 1, wherein:
    a self-aligned stop layer is further formed on the top of the gate structure;
    the step of forming the gate contact further comprises:
    etching the self-aligned stop layer after the dielectric layer on the top of the gate structure is etched; and
    in the step of etching the self-aligned stop layer, an etch selection ratio of a material of the self-aligned stop layer to a material of the etch stop layer is greater than or equal to 5:1.

11. The method for forming a semiconductor structure according to claim 1, wherein the etch stop layer is made of silicon nitride or silicon carbide.

12. The method for forming a semiconductor structure according to claim 1, wherein a process for forming the etch stop layer comprises an atomic layer deposition process.

13. The method for forming a semiconductor structure according to claim 1, wherein a portion of the thickness of the initial dielectric layer is removed using a dry etching process.

* * * * *